(12) United States Patent
Tsuchiya

(10) Patent No.: US 6,633,192 B2
(45) Date of Patent: Oct. 14, 2003

(54) LEVEL SHIFT CIRCUIT AND SEMICONDUCTOR DEVICE USING THE SAME

(75) Inventor: Masahiko Tsuchiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/930,884

(22) Filed: Aug. 14, 2001

(65) Prior Publication Data

US 2002/0113769 A1 Aug. 22, 2002

(30) Foreign Application Priority Data

Sep. 6, 2000 (JP) ........................... 2000-270442

(51) Int. Cl.[7] .................................. H03K 19/0185
(52) U.S. Cl. ............................ 327/333; 326/68
(58) Field of Search ..................... 327/333; 326/63, 326/68, 72

(56) References Cited

U.S. PATENT DOCUMENTS

| | | | | |
|---|---|---|---|---|
| 4,039,862 A | * | 8/1977 | Dingwall et al. | 327/333 |
| 4,978,870 A | * | 12/1990 | Chen et al. | 326/68 |
| 6,411,554 B1 | * | 6/2002 | Kawai | 326/68 |
| 6,437,627 B1 | * | 8/2002 | Tran et al. | 327/333 |

FOREIGN PATENT DOCUMENTS

| | | |
|---|---|---|
| JP | 02-301323 | 12/1990 |
| JP | 05-199101 | 8/1993 |
| JP | 05-308274 | 11/1993 |
| JP | 08-046508 | 2/1996 |

\* cited by examiner

Primary Examiner—Toan Tran
(74) Attorney, Agent, or Firm—Hogan & Hartson LLP

(57) ABSTRACT

A first and second circuits are connected in parallel between a first supply line supplying a first potential and a second supply line supplying a second potential. Each of the first and second circuits has first and second P-type transistors and an N-type transistor connected in series in order from the first-supply-line side. The gate of the first P-type transistor in the first circuit is connected to the drain of the N-type transistor in the second circuit. The gate of the first P-type transistor in the second circuit is connected to the drain of the N-type transistor in the first circuit. Input potentials opposite to each other are applied to the gates of the N-type transistors in the first and second circuits respectively and output potentials level-shifted from the input potentials are output from the drains of the N-type transistors in the first and second circuits respectively. A third supply line supplying a third potential between the first and second potentials is connected to the gate of the second P-type transistor in each of the first and second circuits.

23 Claims, 10 Drawing Sheets

LEVEL SHIFT CIRCUIT AND SEMICONDUCTOR DEVICE USING THE SAME

Japanese Patent Application No. 2000-270442, filed Sep. 6, 2000, is hereby incorporated by reference in its entirety.

TECHNICAL FIELD

The present invention relates to a level shift circuit and a semiconductor device, such as a liquid crystal driver IC, which uses the level shift circuit.

BACKGROUND

The output of a level shift circuit is switched fast by changing an input signal to the gate of an N-type MOS transistor (hereinafter called "NMOS transistor") connected to a P-type MOS transistor (hereinafter called "PMOS transistor") from a low level to a high level while the PMOS transistor is on.

In the level shift circuit, therefore, the series-connected PMOS transistor and NMOS transistor are turned on at the same time.

To enable fast switching in the level shift circuit, the logic of the output terminal connected to the drain of the NMOS transistor should be switched to LOW from HIGH quickly under that situation.

To meet the necessity, the current drive capability of the PMOS transistor is lowered while the current drive capability of the NMOS transistor is increased.

A current i which flows between the source and drain of an MOS transistor is $i=\beta(V_{GS}-Vth)^2/2$. The coefficient $\beta$ is inversely proportional to the gate length of the transistor and proportional to the gate width. Therefore, it is normal to make the gate length longer in order to reduce the current drive capability of the PMOS transistor and to widen the gate width in order to increase the current drive capability of the NMOS transistor. This inevitably increases the occupation area of the level shift circuit.

A large number of level shift circuits of this type are provided in a semiconductor device. In case where the semiconductor device is a liquid crystal driver IC, for example, the total quantity of the level shift circuits needed merely to generate a liquid crystal drive potential is equal to the number of at least signal electrodes. Accordingly, there are demands of reducing the occupation area of each level shift circuit.

SUMMARY

Accordingly, aspects of the present invention can provide a level shift circuit of which occupation area can be reduced while ensuring a fast switching operation.

Further aspects of the present invention can provide integrated semiconductor devices which incorporate a level shift circuit with a small occupation area and is therefore suitable for a display drive IC to drive a liquid crystal.

A level shift circuit according to first aspects of the present invention comprises first and second circuits connected in parallel between a first supply line supplying a first potential and a second supply line supplying a second potential lower in an absolute value than the first potential, wherein each of the first and second circuits includes first and second transistors of a first conductivity type and a second conductivity type transistor connected in series between the first and second supply lines in order from a first-supply-line side, wherein a gate of the first transistor of the first conductivity type in the first circuit is connected to a drain of the second conductivity type transistor in the second circuit, wherein a gate of the first transistor of the first conductivity type in the second circuit is connected to a drain of the second conductivity type transistor in the first circuit, wherein input potentials opposite to each other are applied to gates of the second conductivity type transistors in the first and second circuits respectively, and output potentials level-shifted from the input potentials are output from drains of the second conductivity type transistors in the first and second circuits respectively, and wherein a third supply line supplying a third potential via a resistor between the first and second potentials is connected to a gate of the second transistor of the first conductivity type in each of the first and second circuits.

In a level shift circuit according to a second aspect of the present invention, the second transistor of the first conductivity type in each of the first and second circuits is depletion type and the gate of the second transistor of the first conductivity type in each of the first and second circuits is connected to the first supply line.

DETAILED DESCRIPTION

A level shift circuit according to one embodiment of the present invention comprises first and second circuits connected in parallel between a first supply line supplying a first potential and a second supply line supplying a second potential lower in an absolute value than the first potential, wherein each of the first and second circuits includes first and second transistors of a first conductivity type and a second conductivity type transistor connected in series between the first and second supply lines in order from a first-supply-line side, wherein a gate of the first transistor of the first conductivity type in the first circuit is connected to a drain of the second conductivity type transistor in the second circuit, wherein a gate of the first transistor of the first conductivity type in the second circuit is connected to a drain of the second conductivity type transistor in the first circuit, wherein input potentials opposite to each other are applied to gates of the second conductivity type transistors in the first and second circuits respectively, and output potentials level-shifted from the input potentials are output from drains of the second conductivity type transistors in the first and second circuits respectively, and wherein a third supply line supplying a third potential between the first and second potentials is connected to a gate of the second transistor of the first conductivity type in each of the first and second circuits. (See FIGS. 1, 7 and 9)

According to the embodiment of the present invention, even when the first transistor of the first conductivity type and the second conductivity type transistor in one of the first and second circuits are turned on at the same time, the potential of the output signal can be switched quickly by the ON action of the second conductivity type transistor.

This is because the intermediate potential between the first and second potentials is supplied to the gate of the second transistor of the first conductivity type, so that the current flowing in the second transistor of the first conductivity type is reduced, thus reducing the current flowing in the first transistor of the first conductivity type that is located upstream of the second transistor of the first conductivity type.

It is therefore unnecessary to reduce the current drive capability of the first transistor of the first conductivity type and increase the current drive capability of the second conductivity type transistor.

Figure 5:
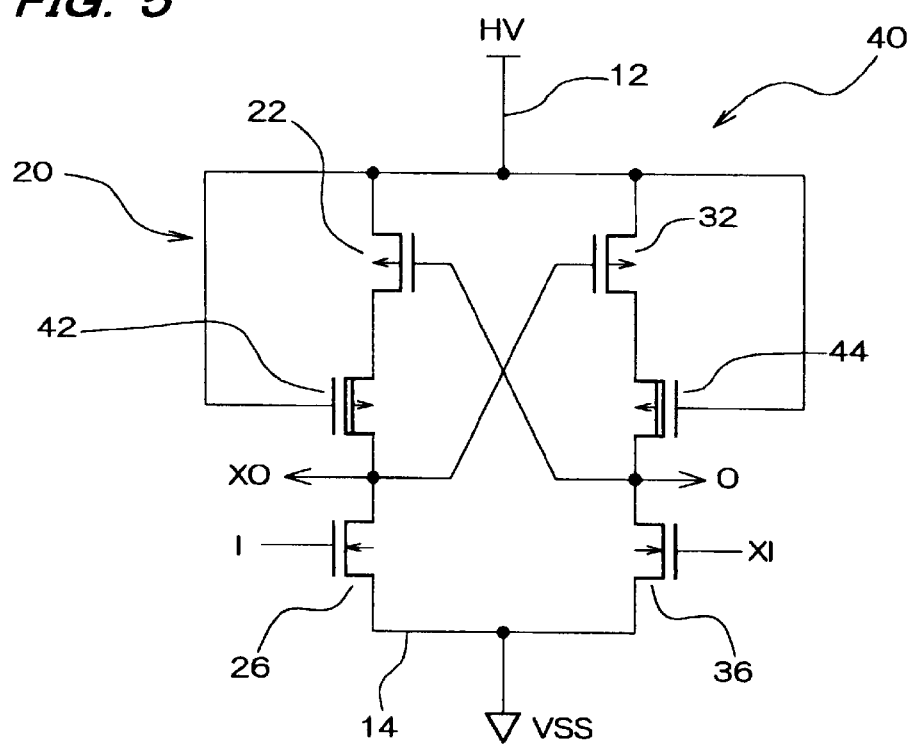
FIG. 5 is a circuit diagram of a level shift circuit according to a second embodiment of the present invention.
Figure 8:
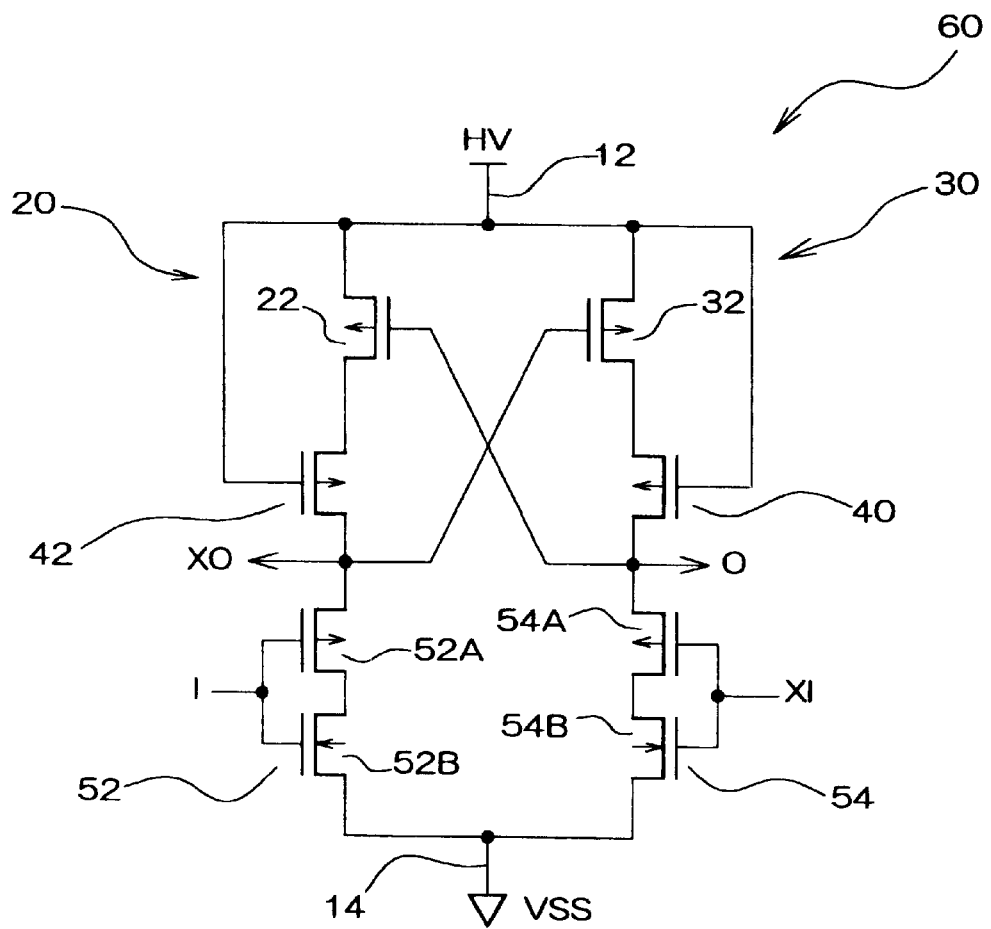
FIG. 8 is a circuit diagram of a modification in which NMOS transistor in the level shift circuit shown in FIG. 5 is replaced with CMOS transistors.
Figure 11:
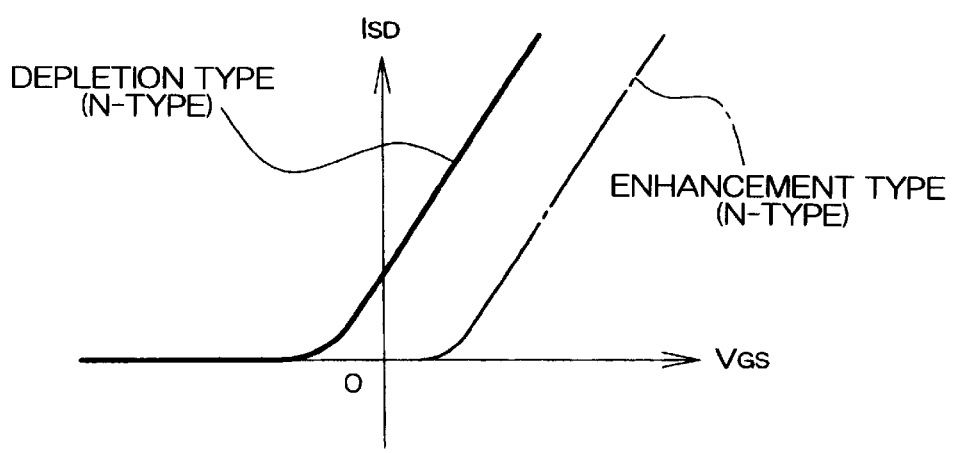
FIG. 11 is a voltage-current characteristic of a depletion type MOS transistor (N-type) used in the level shift circuit shown in FIG. 10.

In a level shift circuit according to another embodiment of the present invention, the second transistor of the first conductivity type in each of the first and second circuits is depletion type, and a gate of the second transistor of the first conductivity type in each of the first and second circuits is connected to the first supply line, in the level shift circuit of the above-described embodiment of the present invention (see FIGS. 5, 8 and 11).

According to the second embodiment of the present invention, in case where the first transistor of the first conductivity type and the second conductivity type transistor in one of the first and second circuits are turned on at the same time, the potential of the output signal can be switched quickly by the ON action of the second conductivity type transistor for the following reason.

Because the second transistor of the first conductivity type is of a depletion type and the first potential is supplied to the gate of that transistor, the current flowing in the second transistor of the first conductivity type is reduced (see FIG. 6), resulting in the reduction in the current flowing in the first transistor of the first conductivity type that is located upstream of the second transistor of the first conductivity type.

It is therefore unnecessary to reduce the current drive capability of the first transistor of the first conductivity type and increase the current drive capability of the second conductivity type transistor.

In the both embodiments, in each of the first and second circuits, a current drive capability of the first transistor of the first conductivity type may be substantially equal to a current drive capability of the second conductivity type transistor. Further, the first and second transistors of the first conductivity type in each of the first and second circuits may have substantially same size. This can make the area of the level shift circuit smaller than that of the level shift circuit of the related art.

Each of the first and second circuits may further include a third transistor of the first conductivity type connected between the second transistor of the first conductivity type and the second conductivity type transistor and a gate of the third transistor of the first conductivity type may be connected to a gate of the second conductivity type transistor. (see FIGS. 7 and 8).

Because one of the third transistor of the first conductivity type and the second conductivity type transistor is turned off while the other is turned on, the consumption current that flows between the first and second supply lines can be reduced.

A further embodiment of the present invention is a semiconductor device incorporating at least one level shift circuit described above. When the semiconductor device is formed using a P-type semiconductor substrate, the first and second transistors of the first conductivity type formed on the P-type semiconductor substrate may be P-type and the second conductivity type transistor may be N-type (see FIGS. 1 and 5).

When the semiconductor device is formed using an N-type semiconductor substrate, on the other hand, the first and second transistors of the first conductivity type formed on the N-type semiconductor substrate may be N-type and the second conductivity type transistor may be P-type. (see FIGS. 9 and 11).

The semiconductor device may further comprise a signal generating circuit which generates a potential selection signal based on the output potentials from the at least one level shift circuit; and a drive circuit which selects and outputs one of a plurality of display drive potentials based on the potential selection signal from the signal generating circuit.

Adapting the semiconductor device according to the third embodiment of the present invention to a display drive IC having the above-described structure, e.g., a liquid crystal driver IC, can contribute to miniaturization or large-scale integration of the display drive IC on which multiple level shift circuits are mounted.

Embodiments of the present invention will now be described with reference to the accompanying drawings.

First Embodiment

Structure of Level Shift Circuit

Figure 1:
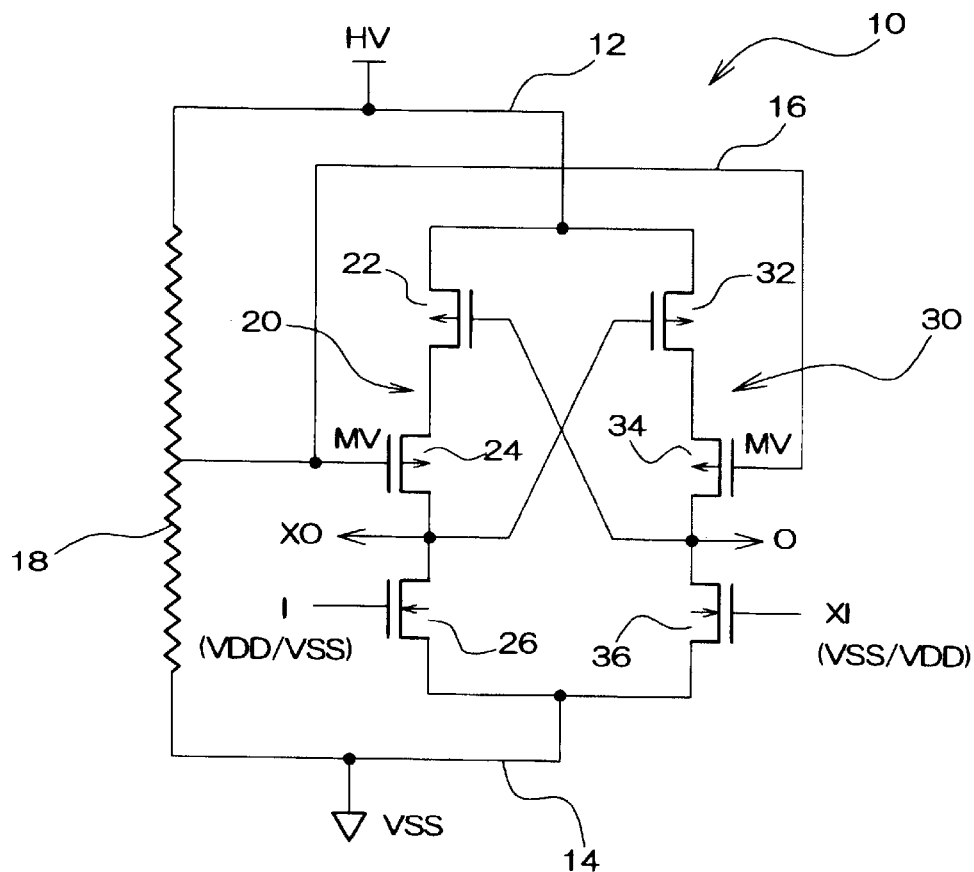
FIG. 1 is a circuit diagram of a level shift circuit according to a first embodiment of the present invention.

FIG. 1 is a circuit diagram of a level shift circuit according to the first embodiment. This level shift circuit 10 has first and second circuits 20 and 30 connected in parallel between a first supply line 12 for supplying a first potential HV and a second supply line 14 for supplying a second potential VSS.

The first potential HV is acquired by boosting a voltage supply potential VDD (e.g., VDD=3 V) of a semiconductor device on which the level shift circuit 10 is mounted, and is, for example, 9 to 10 V. The second potential VSS is a voltage supply potential VSS of the semiconductor device and is 0 V. Note that the semiconductor device is formed on a P-type semiconductor substrate.

The first circuit 20 has a first PMOS transistor 22, a second PMOS transistor 24 and an NMOS transistor 26 connected in series between the first supply line 12 and the second supply line 14.

Likewise, the second circuit 30 has a first PMOS transistor 32, a second PMOS transistor 34 and an NMOS transistor 36 connected in series between the first supply line 12 and the second supply line 14.

The potential of the drain terminal of the NMOS transistor 26 of the first circuit 20 is an inverted output signal XO of the Level shift circuit 10, and the potential of the drain terminal of the NMOS transistor 36 of the second circuit 30 is an output signal 0 of the level shift circuit 10. The inverted output signal XO is supplied to the gate of the first PMOS transistor 32 of the second circuit 30, and the output signal 0 to the gate of the first PMOS transistor 22 of the first circuit 20.

An input signal I to the level shift circuit 10 is supplied to the gate of the NMOS transistor 26 of the first circuit 20, and the other input signal, XI, to the gate of the NMOS transistor 36 of the second circuit 30.

The input signals I and XI have opposite potentials which change to the voltage supply potentials VDD and VSS, and are generated by an unillustrated logic circuit.

A third supply line 16 is commonly connected to the gates of the second PMOS transistors 24 and 34 of the first and second circuits 20 and 30.

The third supply line 16 is connected to a midway point of a resistor 18 connected between the first and second supply lines 12 and 14. Therefore, the third supply line 16 supplies an intermediate potential MV (VSS<MV<HV) which is acquired by voltage-dividing the voltage between the high potential HV and the voltage supply potential VSS by the resistor 18.

While the first potential HV is supplied to the source of each of the second PMOS transistors 24 and 34, therefore, each of the second PMOS transistors 24 and 34 stays in a state between ON and OFF, allowing a minute current to flow between the source and drain.

Operation of Level Shift Circuit

Figure 2:
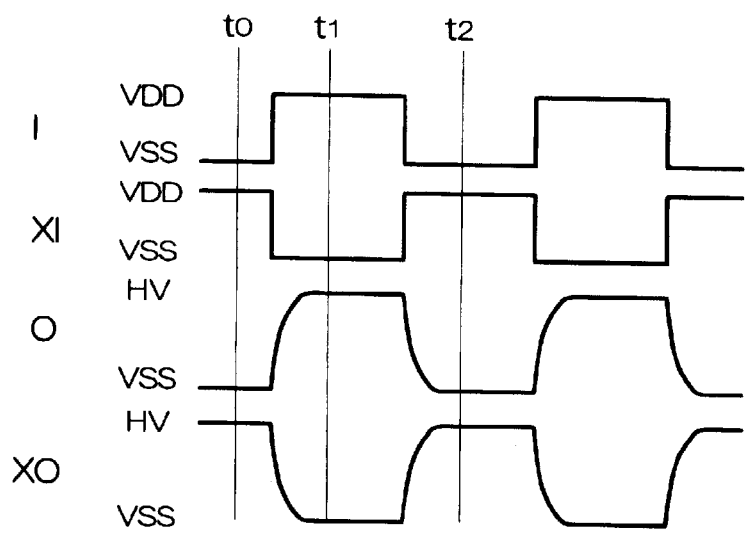
FIG. 2 is a waveform diagram showing the input and output characteristics of the level shift circuit shown in FIG. 1.

FIG. 2 is a waveform diagram showing the input and output characteristics of the level shift circuit shown in FIG. 1. As shown in FIG. 2, I=LOW (VSS), XI=HIGH (VDD), O=LOW (VSS) and XO=HIGH (HV) in the initial state at time t0. In the initial state, the MOS transistors 22 and 36 are turned on and the MOS transistors 26 and 32 are turned off.

When the input signal I rises high from the LOW level from the initial state, the NMOS transistor 26 of the first circuit 20 is turned on, and when the input signal XI falls low from the HIGH level, the NMOS transistor 36 of the second circuit 30 is turned off.

At this time, in the first circuit 20, the first PMOS transistor 22 on the high potential (HV) side and the NMOS transistor 26 on the low potential (VSS) side are both turned on.

As the second PMOS transistor 24 located closer to the high potential (HV) side than the NMOS transistor 26 permits only a minute current to flow as mentioned above, however, the potential of the output signal XO promptly falls to the ground potential VSS, thus ensuring fast switching.

The above-described operation is accomplished even when the first PMOS transistor 22 and the NMOS transistor 26 in the first circuit 20 have the equal current drive capability. Unlike the related art, the embodiment does not need to provide a difference in capability between both transistors. That is, it is unnecessary to increase the gate length of the first PMOS transistor 22 in order to reduce the current drive capability thereof. Likewise, it is unnecessary to widen the gate width of the NMOS transistor 26 in order to increase the current drive capability thereof. The embodiment can therefore reduce the occupation area of the first circuit 20 in the level shift circuit 10.

When the output signal XO becomes the ground potential VSS, the first PMOS transistor 32 to whose gate the output signal XO is supplied is turned on.

At this time, in the second circuit 30, the first PMOS transistor 32 connected to the high potential (HV) side is turned on while the NMOS transistor 26 connected to the low potential (VSS) side is turned off. The output signal O therefore quickly goes to the high potential HV. The first PMOS transistor 22 to whose gate the output signal O is supplied is turned off. At time t1 in FIG. 2, therefore, the level shift circuit 10 becomes stable with I=HIGH (VDD), XI=LOW (VSS), O=HIGH (HV) and XO=LOW (VSS).

When the input signal I falls low from the HIGH level and the input signal XI rises high from the LOW level, the operation that has been performed by the first circuit 20 is carried out by the second circuit 30, and the operation that has been executed by the second circuit 30 is carried out by the first circuit 20. This can ensure prompt transition to the stable state at time t2 in FIG. 2.

This operation is also accomplished even when the first PMOS transistor 32 and the NMOS transistor 36 in the second circuit 30 have the equal current drive capability. Unlike the related art, the embodiment does not need to provide a difference in capability between both transistors. Because of the same reason applied to the first circuit 20, the occupation area of the second circuit 30 can be made smaller, which reduces the occupation area of the level shift circuit 10.

The level shift circuit 10 shown in FIG. 1 does not require that the sizes of the current-limiting second PMOS transistors 24 and 34 be increased and can allow both PMOS transistors 24 and 34 to be formed in the same sizes as, those of, for example, the first PMOS transistors 22 and 32.

Description on Comparative Examples

Figure 3:
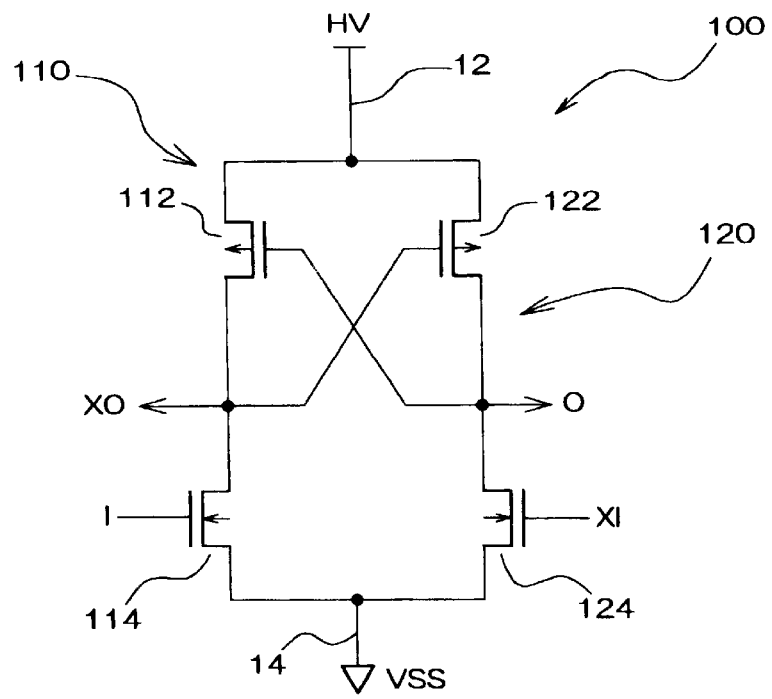
FIG. 3 is a circuit diagram showing a comparative example of the level shift circuit.

FIG. 3 shows a level shift circuit 100 which does not have current-limiting transistors, such as the second PMOS transistors 24 and 26 in FIG. 1. The current drive capabilities of PMOS transistors 112 and 122 in first and second circuits 110 and 120 in FIG. 3 should be reduced by increasing their gate lengths. Further, the current drive capabilities of NMOS transistors 114 and 124 in the first and second circuits 110 and 120 should be increased by widening their gate widths.

This is because when the PMOS transistor 112 and NMOS transistor 114 in the first circuit 110 are both turned on, for example, a larger current should be made to flow in the NMOS transistor 114 to promptly drop the potential of the output signal XO. The same is true of the second circuit 120.

The level shift circuit 100 shown in FIG. 3 is therefore disadvantageous in that its occupation area becomes larger than that of the level shift circuit 10 shown in FIG. 1.

Figure 4:
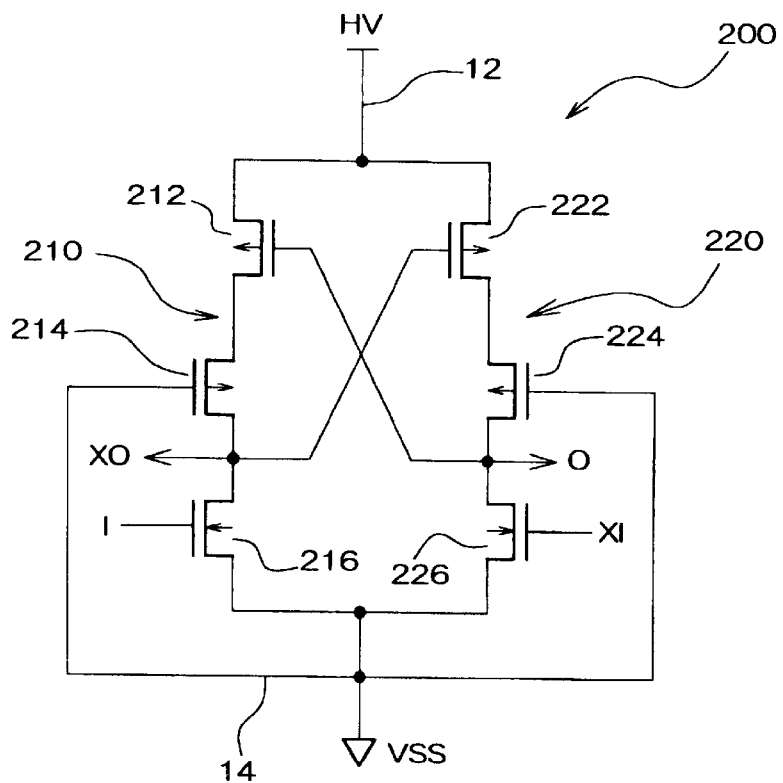
FIG. 4 is a circuit diagram showing another comparative example of the level shift circuit.

FIG. 4 shows another comparative example which has current-limiting transistors, unlike FIG. 3. A level shift circuit 200 shown in FIG. 4 is similar to the level shift circuit 10 shown in FIG. 1 in that a first circuit 210 has first and second PMOS transistors 212 and 214 and an NMOS transistor 216 connected in series. A second circuit 220 likewise has first and second PMOS transistors 222 and 224 and an NMOS transistor 226.

The level shift circuit 200 in FIG. 4 differs from the level shift circuit 10 in FIG. 1 in that the gates of the current-limiting second PMOS transistors 214 and 224 in the first and second circuits 210 and 220 are connected to the second supply line 14 which supplies the potential VSS. Accordingly, the second PMOS transistors 214 and 224 are fully turned on at the same time.

To allow the second PMOS transistors 214 and 224 to limit the current, therefore, their gate lengths should be made longer, resulting in larger sizes. This design can permit, for example, the first PMOS transistor 212 and the NMOS transistor 216 in the first circuit 210 to have substantially the same current drive capabilities as per the embodiment shown in FIG. 1.

However, the comparative example should still face the problem that the occupation area is increased by the increase in the size of the second PMOS transistor 214. This problem also remains for the second circuit 220.

Second Embodiment

FIG. 5 shows a level shift circuit 40 according to the second embodiment of the present invention. The level shift circuit 40 differs from the level shift circuit 10 in FIG. 1 only in the following two points.

The first difference lies in that the second PMOS transistors 14 and 24 in the level shift circuit 10 in FIG. 1 are replaced with depletion type MOS transistors (P-type) 42 and 44 in the level shift circuit 40 in FIG. 5. The other transistors 22, 26, 32 and 36 are of an enhancement type as in the level shift circuit 10 in FIG. 1.

The second difference lies in that the third supply line 16 and the resistor 18 shown in FIG. 1 are not used and the gates of the depletion type MOS transistors 42 and 44 are connected to the first supply line 12 so that the high potential HV is supplied to those gates.

Figure 6:
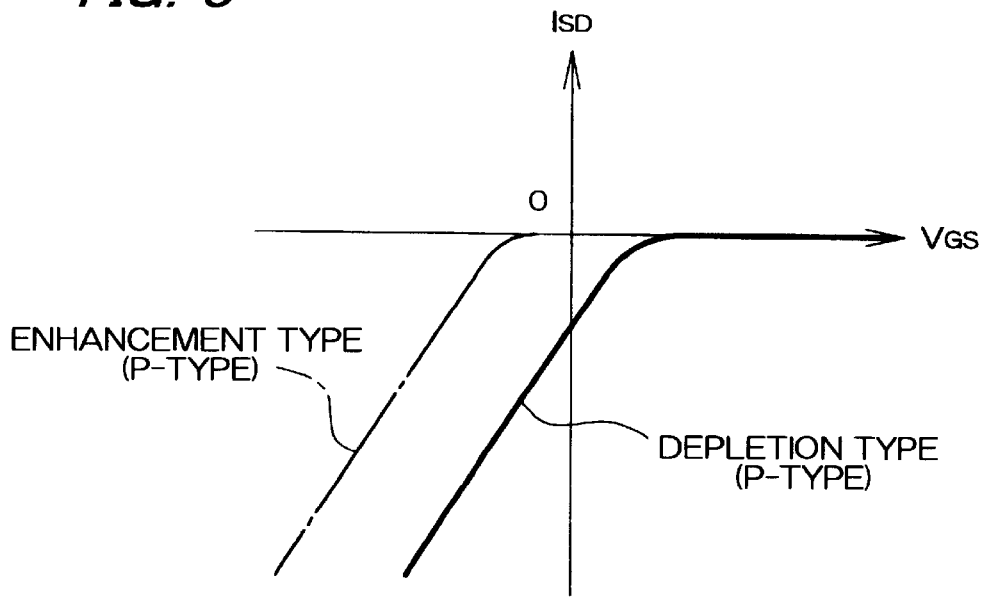
FIG. 6 is a voltage-current characteristic of a depletion type MOS transistor (P-type) used in the level shift circuit shown in FIG. 5.

FIG. 6 is a characteristic chart illustrating the relationship between a gate-source voltage $V_{GS}$ of the depletion type MOS transistors 42 and 44 and a source-drain current $I_{SD}$ thereof.

When the PMOS transistor 22 in the first circuit 20 is turned on, the source and gate potentials of the depletion type MOS transistor 42 both become the high potential HV, so that the gate-source voltage $V_{GS}$ becomes 0 V.

When the gate-source voltage $V_{GS}$ is 0 V, the enhancement type MOS transistor (P-type) is fully turned on as indicated by the one-dot chain line in FIG. 6 but the depletion type MOS transistor 42 is in an intermediate state between ON and OFF as indicated by the solid line in FIG. 6, thereby limiting the current.

The second embodiment, like the first embodiment, can ensure fast switching even when the PMOS transistor 22 and the NMOS transistor 24 are made to have the same current drive capability. In addition, unlike the comparative example shown in FIG. 4, the second embodiment need not increase the size of the depletion type MOS transistor 42 which can be formed in the same size as, for example, the PMOS transistor 22. This makes the occupation area smaller. The same is true of the second circuit 30 shown in FIG. 5.

Modification of Level Shift Circuit

Figure 7:
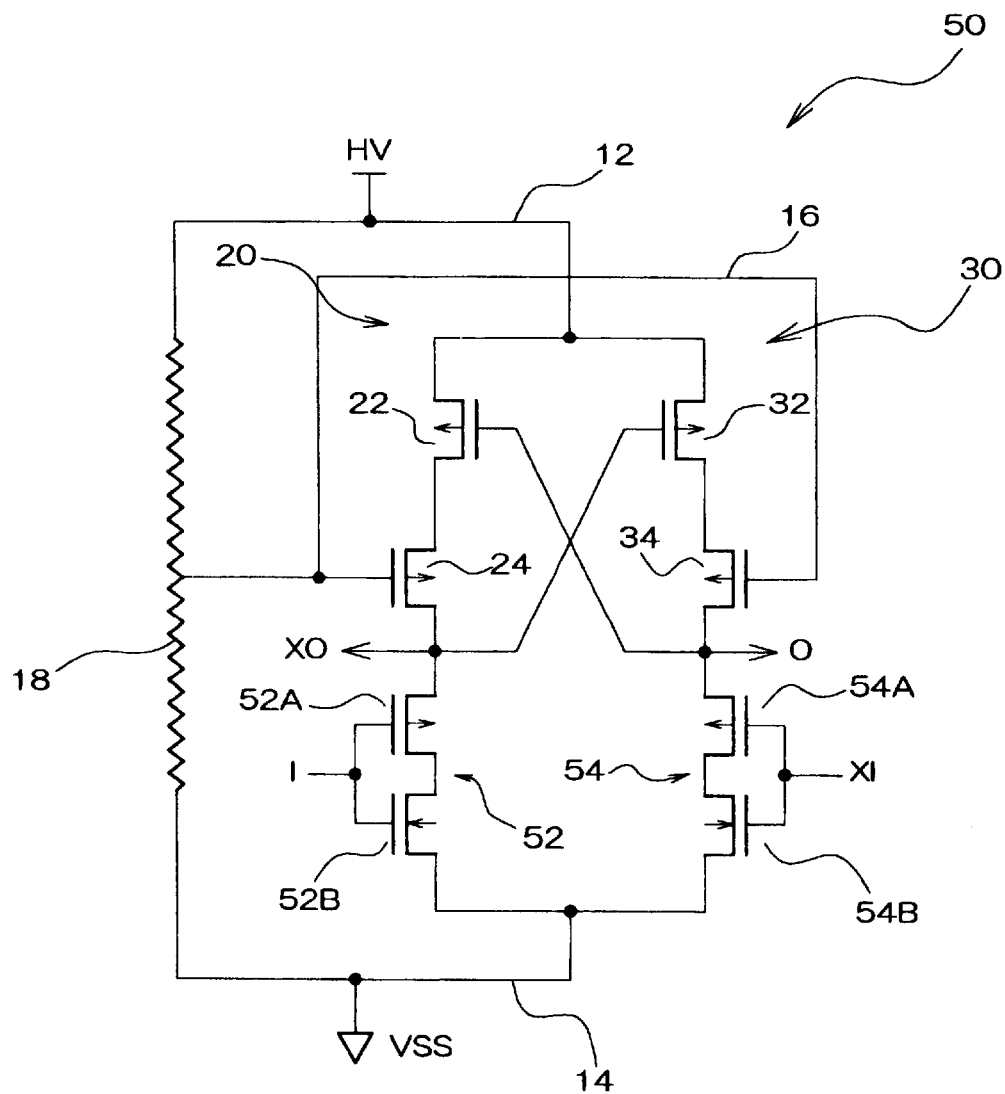
FIG. 7 is a circuit diagram of a modification in which NMOS transistors in the level shift circuit shown in FIG. 1 are replaced with CMOS transistors.

FIG. 7 illustrates a level shift circuit 50 in which the NMOS transistors 26 and 36 in the level shift circuit 10 shown in FIG. 1 are respectively replaced with CMOS transistors 52 and 54.

The CMOS transistor 52 has a PMOS transistor 52 and an NMOS transistor 52B connected in series with the input signal I supplied to the gates of both transistors. The CMOS transistor 54 likewise has a PMOS transistor 54A and an NMOS transistor 54B connected in series with the input signal XI supplied to the gates of both transistors.

The CMOS transistors 52 and 54 have such an advantage as to make the consumption current flowing between the potentials HV and VSS smaller as one of the transistors in each CMOS transistor is turned off while the other transistor is turned on.

FIG. 8 illustrates a level shift circuit 60 in which the NMOS transistors 26 and 36 in the level shift circuit 40 shown in FIG. 5 are respectively replaced with CMOS transistors 52 and 54. The structures and operations of the CMOS transistors 52 and 54 are the same as those of the CMOS transistors 52 and 54 in FIG. 7.

Figure 9:
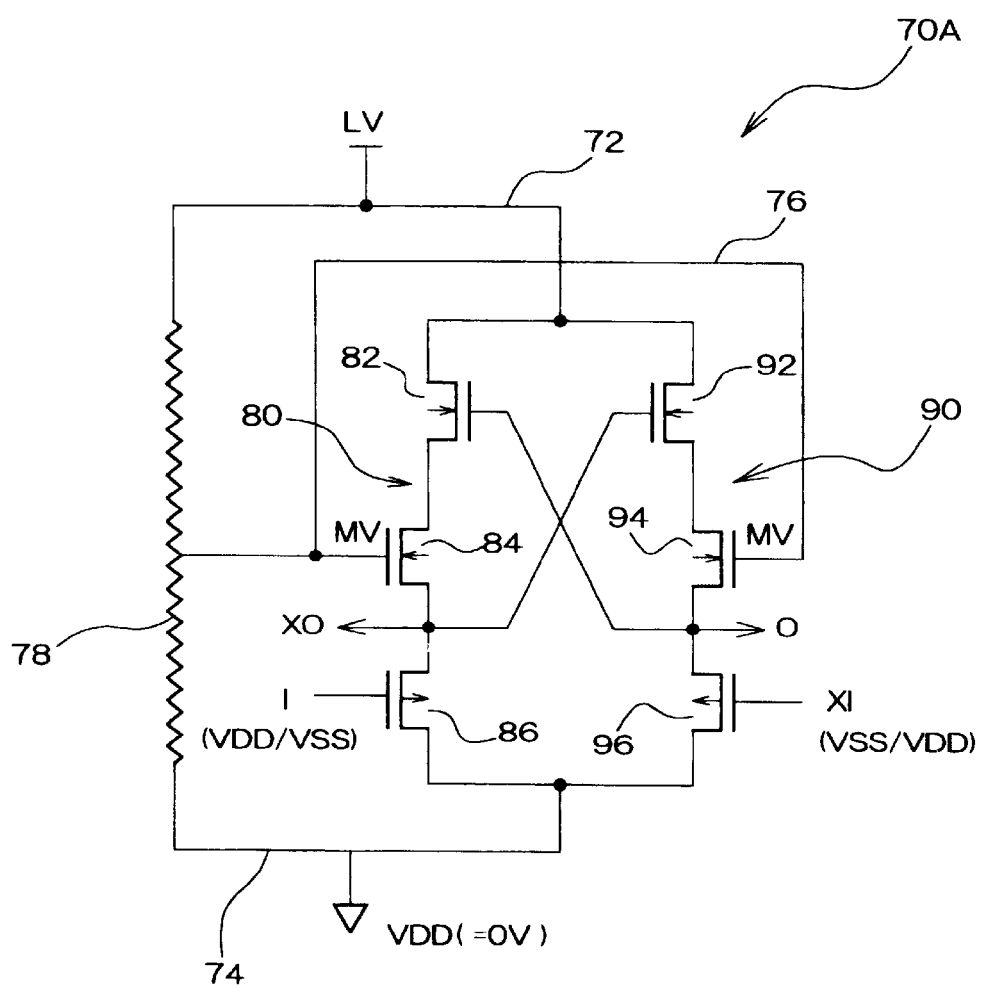
FIG. 9 is a circuit diagram of a level shift circuit which has the same functions as the level shift circuit shown in FIG. 1 and is formed on an N-type semiconductor substrate.

FIG. 9 shows a level shift circuit 70A which is formed on an N-type semiconductor substrate. This level shift circuit 70A has first and second circuits 80 and 90 connected in parallel between a first supply line 72 for supplying a first potential LV and a second supply line 74 for supplying a second potential VDD.

The first potential LV is acquired by boosting a voltage supply potential VSS (e.g., VSS=−3 V) of a semiconductor device on which the level shift circuit 70A is mounted, and is, for example, −9 to −10 V. The second potential VDD is a voltage supply potential VDD of the semiconductor device and is 0 V. The absolute value of the second potential VDD is smaller than the absolute value of the first potential LV.

The first circuit 80 has a first NMOS transistor 82, a second NMOS transistor 84 and a PMOS transistor 86 connected in series between the first supply line 72 and the second supply line 74.

Likewise, the second circuit 90 has a first NMOS transistor 92, a second NMOS transistor 94 and a PMOS transistor 96 connected in series between the first supply line 72 and the second supply line 74.

The potential of the drain terminal of the PMOS transistor 86 of the first circuit 80 is an output signal XO of the level shift circuit 70A, and the potential of the drain terminal of the PMOS transistor 96 of the second circuit 90 is an output signal O of the level shift circuit 70A. The inverted output signal XO is supplied to the gate of the first NMOS transistor 92 of the second circuit 90, and the output signal O to the gate of the first NMOS transistor 82 of the first circuit 80.

An input signal I to the level shift circuit 70A is supplied to the gate of the PMOS transistor 86 of the first circuit 80, and the other input signal, XI, to the gate of the PMOS transistor 96 of the second circuit 90.

A third supply line 76 is commonly connected to the gates of the second NMOS transistors 84 and 94 of the first and second circuits 80 and 90.

The third supply line 76 is connected to a midway point of a resistor 78 connected between the first and second supply lines 72 and 74. Therefore, the third supply line 76 supplies an intermediate potential MV (VDD<MV<LV) which is acquired by voltage-dividing the voltage between the low potential LV and the voltage supply potential VDD by the resistor 78.

Therefore, each of the second NMOS transistors 84 and 94 stays in a state between ON and OFF, allowing a minute current to flow between the source and drain. The level shift circuit 70A shown in FIG. 9 can therefore operate in the same way as the level shift circuit 10 shown in FIG. 1.

Figure 10:
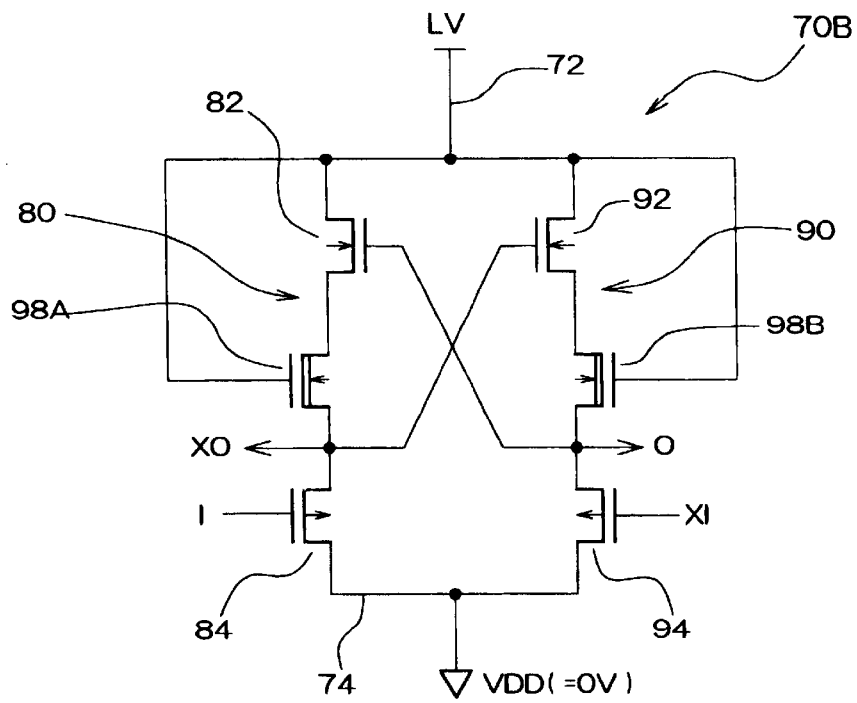
FIG. 10 is a circuit diagram of a level shift circuit which has the same functions as the level shift circuit shown in FIG. 6 and is formed on an N-type semiconductor substrate.

FIG. 10 shows a level shift circuit 70B in which the second NMOS transistors 84 and 94 in the level shift circuit 70A in FIG. 9 are replaced with depletion type MOS transistors (N-type) 98A and 98B. The other transistors 82, 86, 92 and 96 are of an enhancement type as in the level shift circuit 70A in FIG. 9.

In the level shift circuit 70B in FIG. 10, the third supply line 76 and the resistor 78 shown in FIG. 9 are not used and the gates of the PMOS transistors 98A and 98B are connected to the first supply line 72 so that the low potential LV is supplied to those gates.

FIG. 11 is a characteristic chart illustrating the relationship between a gate-source voltage $V_{GS}$ of the depletion type MOS transistors 98A and 98B and a source-drain current $I_{SD}$ thereof.

When the NMOS transistor 82 in the first circuit 80 is turned on, the source and gate potentials of the depletion type MOS transistor 98A both become the low potential LV, so that the gate-source voltage $V_{GS}$ becomes 0 V.

When the gate-source voltage $V_{GS}$ is 0 V, the enhancement type MOS transistor (N-type) is fully turned on as indicated by the one-dot chain line in FIG. 11 but the depletion type MOS transistor 98A is in an intermediate state between ON and OFF as indicated by the solid line in FIG. 11, thereby allowing the limited current to flow. The second circuit 90 can operate in the same manner by the action of the depletion type MOS transistor 98B.

The PMOS transistors 84 and 94 shown in FIGS. 9 and 10 may be changed to CMOS transistors as in the modification in FIG. 7.

Semiconductor Device with Level Shift Circuit Mounted Thereon

A liquid crystal driver IC which is one example of a display driver IC will be described below as a semiconductor device which incorporates the above-described level shift circuit.

Figure 12:
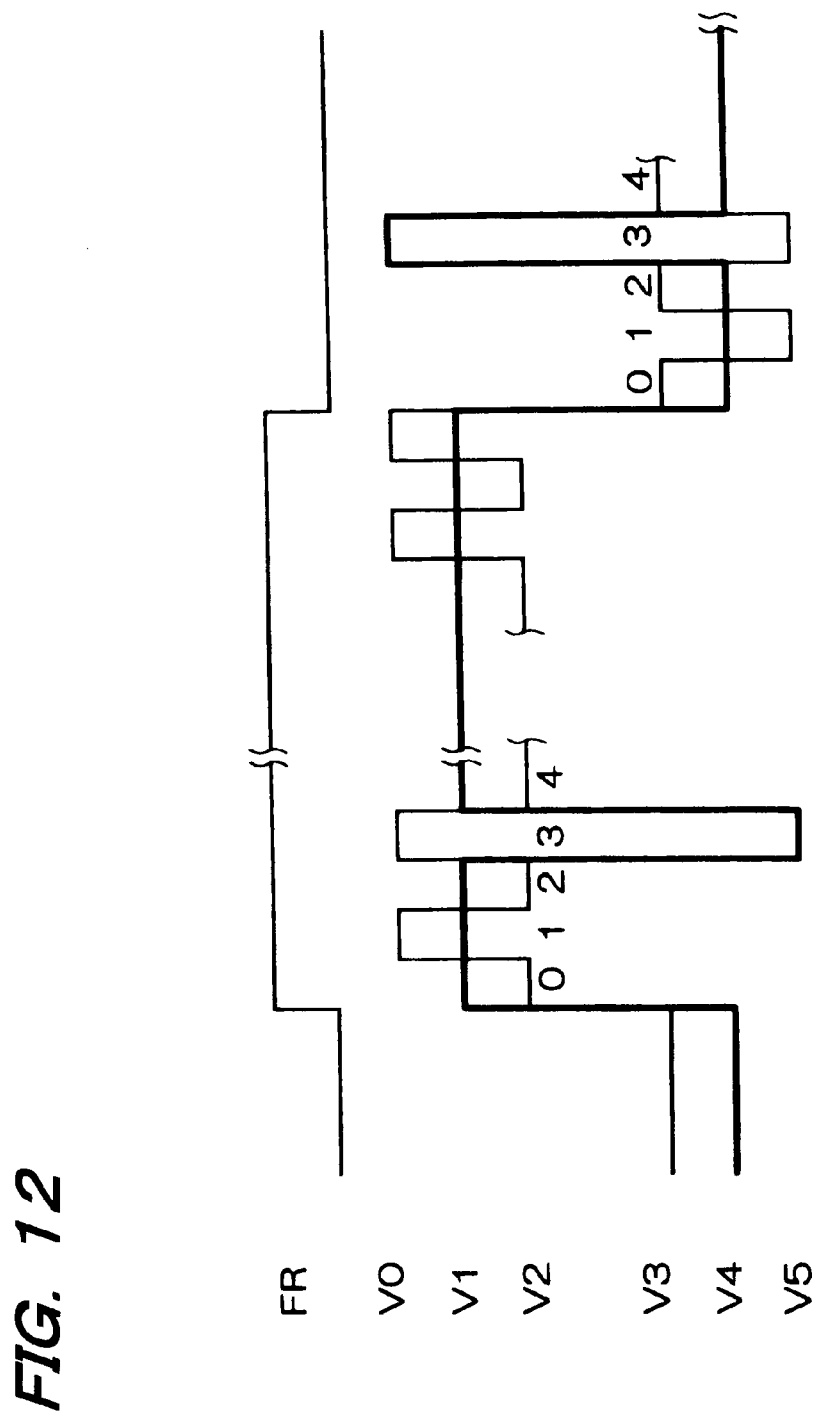
FIG. 12 is a waveform diagram showing one example of liquid-crystal drive waveforms output from a liquid crystal driver IC incorporated in a level shift circuit.

The liquid crystal driver IC is separated into a common driver IC which supplies a drive potential to the common electrodes of a liquid crystal panel of, for example, a passive matrix type and a segment driver IC which supplies a drive potential to the segment electrodes. FIG. 12 shows drive waveforms to be supplied to the electrodes by the respective drive ICs.

Referring to FIG. 12, the thick line indicates a drive waveform to be supplied to the common electrodes by the common driver IC, and the thin line indicates a drive waveform to be supplied to the segment electrodes by the segment driver IC.

In FIG. 12, the polarity of the voltage that is applied to the liquid crystal is inverted between the positive and negative polarities based on a polarity inverting signal FR. Six levels of voltages, for example, V0 to V5, are used as the drive potential.

As shown in FIG. 12, the drive waveform that is supplied from the common driver IC varies among the potentials V0, V1, V4 and V5. The drive waveform that is supplied from the segment driver IC varies among the potentials V0, V2, V3 and V5.

Figure 13:
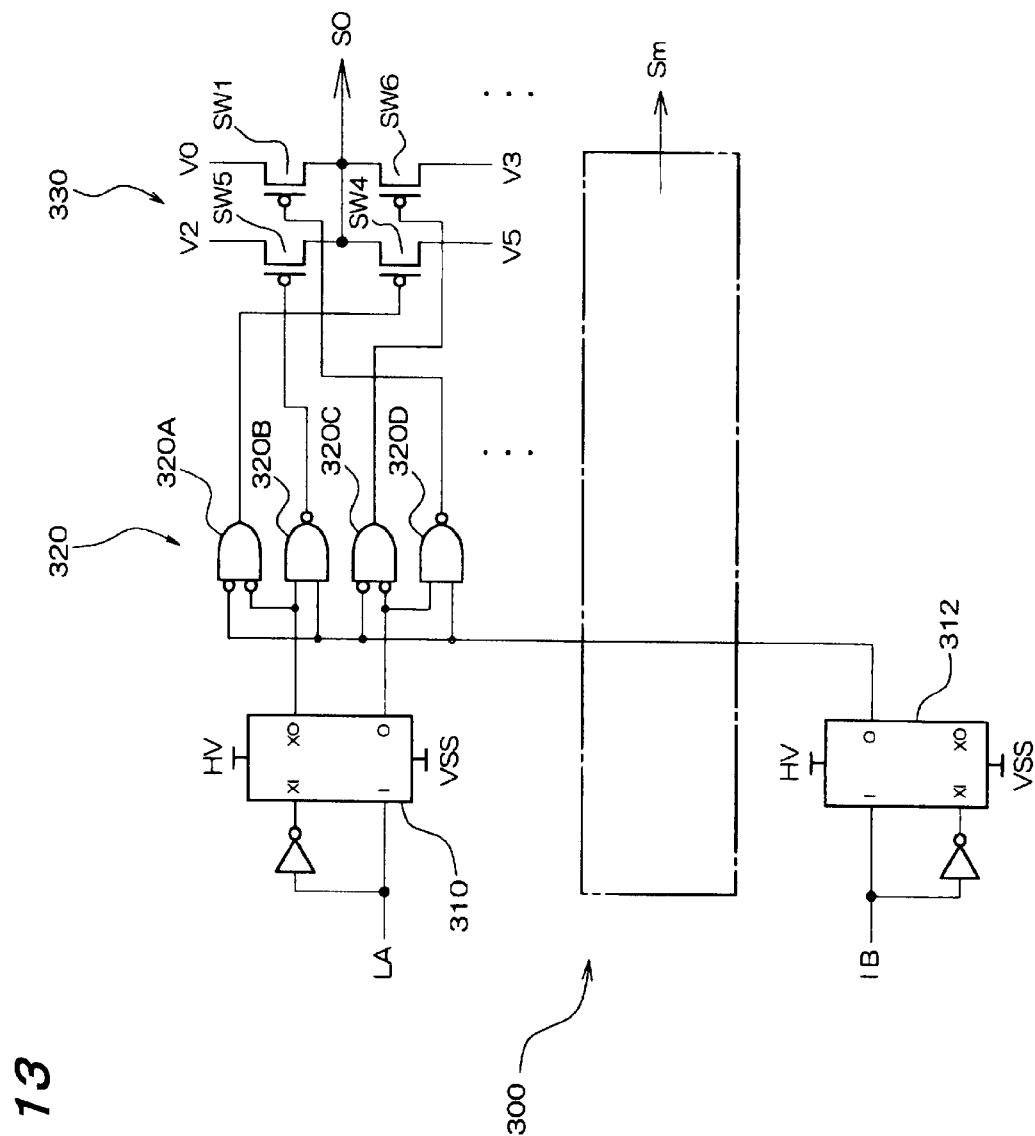
FIG. 13 is a circuit diagram of a segment driver IC which supplies a drive potential to segment electrodes.
Figure 14:
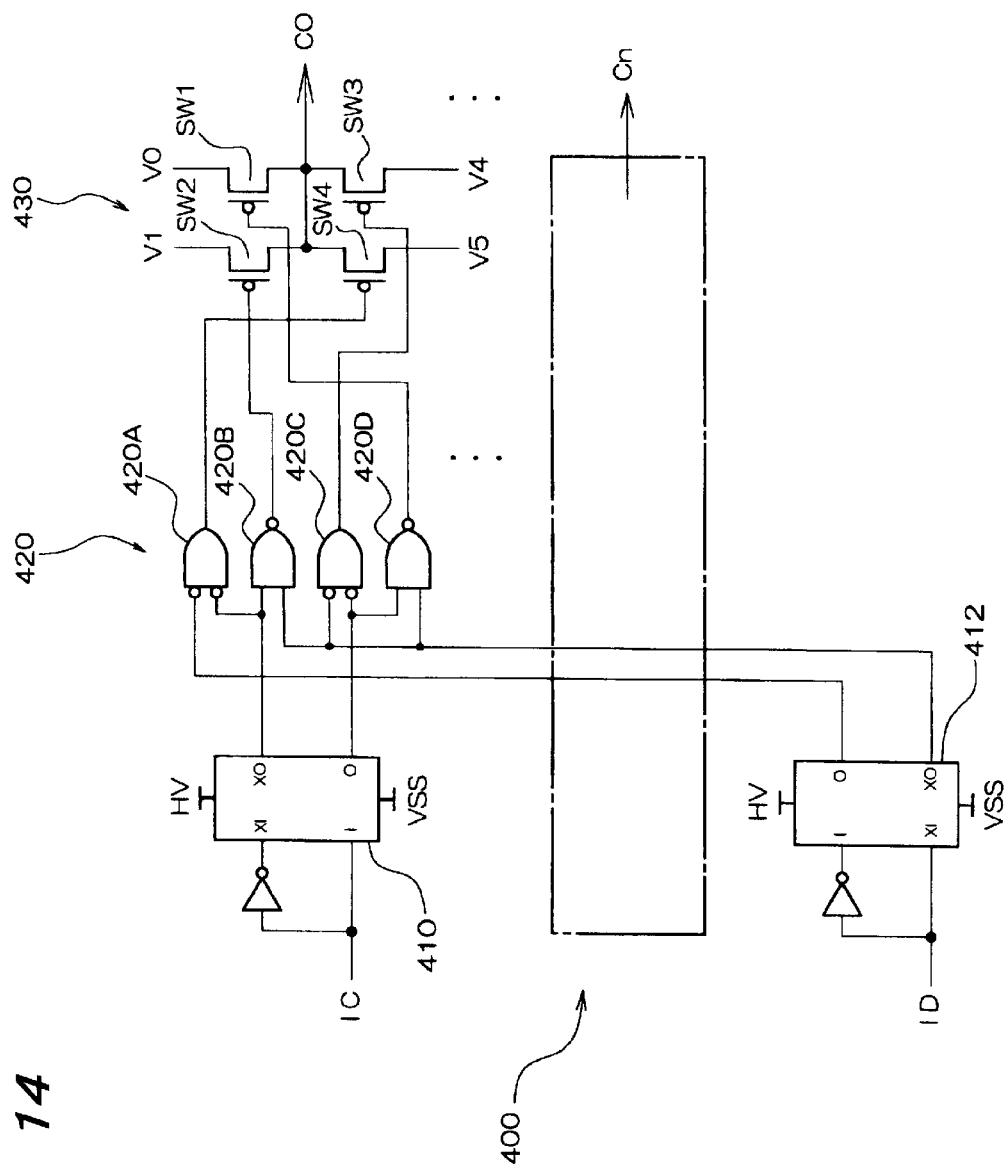
FIG. 14 is a circuit diagram of a common driver IC which supplies a drive potential to common electrodes.

FIG. 13 shows the internal structure of the segment driver IC that supplies a voltage to the segment electrodes, and FIG. 14 shows the internal structure of the common driver IC that supplies a voltage to the common electrodes.

In FIG. 13, a segment driver IC 300 includes level shift circuits 310 which are provided in one-to-one association with segment electrodes S0 to Sm to supply potentials to the respective segment electrodes S0 to Sm, a level shift circuit 312 which is common to all the segment electrodes S0 to Sm, a potential-selection-signal generating circuit 320 and a potential selecting circuit 330.

The potential selecting circuit 330 includes switches SW1 and SW4 to SW6 which select one of the potentials V0, V2, V3 and V5 based on a potential selection signal from the potential-selection-signal generating circuit 320.

The potential-selection-signal generating circuit 320 includes first to fourth logic gates 320A to 320D and controls the ON/OFF actions of the switches SW1 and SW4 to SW6 based on the output signals O and XO of the level shift circuits 310 and 312.

As shown in FIG. 14, a common driver IC 400 likewise has level shift circuits 410 and 412, a potential-selection-signal generating circuit 420 and a potential selecting circuit 430 as the supply system that supplies potentials to common electrodes C0 to Cn.

Given that a signal input to the input terminal I of the level shift circuit 310 is IA and a signal input to the input terminal I of the level shift circuit 312 is IB, the relationship among the logics of the input signals IA and IB and the voltage supplied to the segment electrodes is illustrated in Table 1 below.

TABLE 1

| IA  | H  | H  | L  | L  |
|-----|----|----|----|----|
| IB  | L  | H  | L  | H  |
| SEG | V5 | V0 | V3 | V2 |

Likewise, given that a signal input to the input terminal I of the level shift circuit 410 is IC and a signal input to the input terminal I of the level shift circuit 412 is ID, the relationship among the logics of the input signals IC and ID and the voltage supplied to the common electrodes is illustrated in Table 2 below.

TABLE 2

| IC  | H  | H  | L  | L  |
|-----|----|----|----|----|
| ID  | L  | H  | L  | H  |
| COM | V0 | V5 | V4 | V1 |

The level shift circuits 310, 312, 410 and 412 shown in FIGS. 13 and 14 have one of the structures shown in FIGS. 1, 5 and 7 to 10. Each of the level shift circuits 310, 312, 410 and 412 can therefore output a level-shifted potential (HV–VSS) while performing fast switching based on the logic signals IA, IB, IC and ID from a logic circuit (not shown) which is driven with the voltage supply potentials VDD and VSS received.

The invention is not limited to the above-described embodiments but may be modified in various other manners within the scope of the subject matter of the invention.

What is claimed is:

1. A level shift circuit comprising first and second circuits connected in parallel between a first supply line supplying a first potential and a second supply line supplying a second potential lower in an absolute value than the first potential,
   wherein each of the first and second circuits includes first and second transistors of a first conductivity type, and a second conductivity type transistor connected in series between the first and second supply lines in order from a first-supply-line side,
   wherein a gate of the first transistor of the first conductivity type in the first circuit is connected to a drain of the second conductivity type transistor in the second circuit,
   wherein a gate of the first transistor of the first conductivity type in the second circuit is connected to a drain of the second conductivity type transistor in the first circuit,
   wherein input potentials opposite to each other are applied to gates of the second conductivity type transistors in the first and second circuits respectively, and output potentials level-shifted from the input potentials are output from drains of the second conductivity type transistors in the first and second circuits respectively, and wherein a third supply line supplying a third potential via a resistor connected between the first and second potentials is connected to a gate of the second transistor of the first conductivity type in each of the first and second circuits.

2. The level shift circuit according to claim 1, wherein in each of the first and second circuits, a current drive capability of the first transistor of the first conductivity type is substantially equal to a current drive capability of the second conductivity type transistor.

3. The level shift circuit according to claim 1, wherein the first and second transistors of the first conductivity type in each of the first and second circuits have substantially same size.

4. The level shift circuit according to claim 1, wherein each of the first and second circuits further includes a third transistor of the first conductivity type connected between the second transistor of the first conductivity type and the second conductivity type transistor and a gate of the third transistor of the first conductivity type is connected to the gate of the second conductivity type transistor.

5. A semiconductor device incorporating at least one level shift circuit, the level shift circuit comprising:

first and second circuits connected in parallel between a first supply line supplying a first potential and a second supply line supplying a second potential lower in an absolute value than the first potential, wherein each of the first and second circuits includes first and second transistors of a first conductivity type, and a second conductivity type transistor connected in series between the first and second supply lines in order from a first-supply-line side, wherein a gate of the first transistor of the first conductivity type in the first circuit is connected to a drain of the second conductivity type transistor in the second circuit, wherein a gate of the first transistor of the first conductivity type in the second circuit is connected to a drain of the second conductivity type transistor in the first circuit, wherein input potentials opposite to each other are applied to gates of the second conductivity type transistors in the first and second circuits respectively, and output potentials level-shifted from the input potentials sire output from drains of the second conductivity type transistors in the first and second circuits respectively, and wherein a third supply line supplying a third potential via a resistor between the first and second potentials is connected to a gate of the second transistor of the first conductivity type in each of the first and second circuits.

6. The semiconductor device according to claim 5, comprising a P-type semiconductor substrate, wherein the first and second transistors of the first conductivity type formed on the P-type semiconductor substrate are P-type and the second conductivity type transistor is N-type.

7. The semiconductor device according to claim 5, comprising an N-type semiconductor substrate, wherein the first and second transistors of the first conductivity type formed on the N-type semiconductor substrate are N-type and the second conductivity type transistor is P-type.

8. The semiconductor device according to claim 5, further comprising:

a signal generating circuit which generates a potential selection signal based on the output potentials from the at least one level shift circuit; and a drive circuit which selects and outputs one of a plurality of display drive potentials based on the potential selection signal from the signal generating circuit.

9. A level shift circuit comprising first and second circuits connected in parallel between a first supply line supplying a first potential and a second supply line supplying a second potential lower in an absolute value than the first potential, wherein each of the first and second circuits includes first and second transistors of a first conductivity type and a second conductivity type transistor connected in series between the first and second supply lines in order from a first-supply-line side, wherein a gate of the first transistor of the first conductivity type in the first circuit is connected to a drain of the second conductivity type transistor in the second circuit, wherein a gate of the first transistor of the first conductivity type in the second circuit is connected to a drain of the second conductivity type transistor in the first circuit, wherein input potentials opposite to each other are applied to gates of the second conductivity type transistors in the first and second circuits respectively, and output potentials level-shifted from the input potentials are output from drains of the second conductivity type transistors in the first and second circuits respectively, and wherein the second transistor of the first conductivity type in each of the first and second circuits is depletion type, and a gate of the second transistor of the first conductivity type in each of the first and second circuits is connected to the first supply line.

10. The level shift circuit according to claim 9, wherein in each of the first and second circuits, a current drive capability of the first transistor of the first conductivity type is substantially equal to a current drive capability of the second conductivity type transistor.

11. The level shift circuit according to claim 9, wherein the first and second transistors of the first conductivity type in each of the first and second circuits have substantially same size.

12. The level shift circuit according to claim 9, wherein each of the first and second circuits further includes a third transistor of the first conductivity type connected between the second transistor of the first conductivity type and the second conductivity type transistor and a gate of the third transistor of the first conductivity type is connected to the gate of the second conductivity type transistor.

13. A semiconductor device incorporating at least one level shift circuit comprising first and second circuits connected in parallel between a first supply line supplying a first potential and a second supply line supplying a second potential lower in an absolute value than the first potential, wherein each of the first and second circuits includes first and second transistors of a first conductivity type and a second conductivity type transistor connected in series between the first and second supply lines in order from a first-supply-line side, wherein a gate of the first transistor of the first conductivity type in the first circuit is connected to a drain of the second conductivity type transistor in the second circuit, wherein a gate of the first transistor of the first conductivity type in the second circuit is connected to a drain of the second conductivity type transistor in the first circuit, wherein input potentials opposite to each other are applied to gates of the second conductivity type transistors in the first and second circuits respectively, and output potentials level-shifted from the input potentials are output from drains of the second conductivity type transistors in the first and second circuits respectively, and wherein the second transistor of the first conductivity type in each of the first and second circuits is depletion type, and a gate of the second transistor of the first conductivity type in each of the first and second circuits is connected to the first supply line.

14. The semiconductor device according to claim 13, comprising a P-type semiconductor substrate, wherein the first and second transistors of the first conductivity type formed on the P-type semiconductor substrate are P-type and the second conductivity type transistor is N-type.

15. The semiconductor device according to claim 13, comprising an N-type semiconductor substrate, wherein the first and second transistors of the first conductivity type formed on the N-type semiconductor substrate are N-type and the second conductivity type transistor is P-type.

16. The semiconductor device according to claim 13, further comprising:

a signal generating circuit which generates a potential selection signal based on the output potentials from the at least one level shift circuit; and a drive circuit which selects and outputs one of a plurality of display drive potentials based on the potential selection signal from the signal generating circuit.

17. The level shift circuit according to claim 1, wherein the third potential is different than the input potentials and causes a first current flow in the second transistor of the first conductivity type to be reduced and causes a second current flow in the first transistor of the first conductivity type to be reduced.

18. The level shift circuit according to claim 17, wherein the gates of the second transistors of the first conductivity type are directly coupled to each other via the third supply line.

19. The level shift circuit according to claim 1, wherein the second transistors of the first conductivity type are directly coupled to the second conductivity type transistors.

20. The level shift circuit according to claim 1, wherein the sources of the second conductivity type transistors are at the second potential.

21. The level shift circuit according to claim 1, wherein the third supply line supplies the third potential via the resistor connected between the first potential and the second potential to divide the voltage between the first potential and the second potential.

22. The level shift circuit according to claim 1, wherein the gate of the first transistor of the first conductivity type in the first circuit is directly coupled to the second transistor of the first conductivity type in the second circuit.

23. The level shift circuit according to claim 1, wherein the gate of the first transistor of the first conductivity type in the second circuit is directly coupled to the second transistor of the first conductivity type in the first circuit and the drain of the second conductivity type transistor.

* * * * *